(12) United States Patent
Van Der Valk et al.

(10) Patent No.: US 7,096,243 B2
(45) Date of Patent: Aug. 22, 2006

(54) FLEXIBLE DECIMATOR

(75) Inventors: Robertus Laurentius Van Der Valk, Dordrecht (NL); Johannes Hermanus Aloysius De Rijk, Rotterdam (NL)

(73) Assignee: Zarlink Semiconductor Inc., Kanata (CA)

( * ) Notice: Subject to any disclaimer, the term of this patent is extended or adjusted under 35 U.S.C. 154(b) by 632 days.

(21) Appl. No.: 10/348,308

(22) Filed: Jan. 21, 2003

(65) Prior Publication Data
US 2003/0177156 A1 Sep. 18, 2003

(30) Foreign Application Priority Data
Jan. 22, 2002 (GB) ................... 0201333

(51) Int. Cl.
*G06F 17/17* (2006.01)
(52) U.S. Cl. .................... 708/313
(58) Field of Classification Search .............. 708/313, 708/445
See application file for complete search history.

(56) References Cited
U.S. PATENT DOCUMENTS 4,281,318 A * 7/1981 Candy et al. ............... 341/61
5,068,818 A * 11/1991 Uramoto et al. ........... 708/445
5,079,734 A    1/1992 Riley
5,191,547 A    3/1993 Kawamoto et al.
5,548,540 A    8/1996 Staver et al.
6,137,349 A   10/2000 Menkhoff et al.

FOREIGN PATENT DOCUMENTS

EP    0 909 028 A2   4/1999
GB    2077068 A     12/1981

* cited by examiner

*Primary Examiner*—Chuong D. Ngo
(74) *Attorney, Agent, or Firm*—Lawrence E. Laubscher, Jr.

(57) ABSTRACT

A decimator for use in digital signal processing has an input line for receiving a sequence of input samples at a first sampling rate and a first register for accumulating input samples for which the order in the sequence is a power of a predetermined number greater than one. A control unit for outputs samples from the first register at a second sampling rate. Typically accumulates input samples for which the order in the sequence is a not power of the predetermined number so that the first register accumulates input samples for which the order of said sequence is a power of the predetermined number combined with a current accumulated value in the second register.

19 Claims, 6 Drawing Sheets

FLEXIBLE DECIMATOR

FIELD OF THE INVENTION

This invention relates to the field of digital signal processing, and more particularly to a decimator.

BACKGROUND OF THE INVENTION

Digital filtering is employed in many areas, for example, in measurement systems, source coding, echo cancellation etc. A relatively common filter function is decimation.

A decimator is a structure that combines samples into a single sample. It typically consists of an electronic hardware structure (ASIC's, FPGA's and the like) or software (DSP's), and can be used in any environment where sampling is possible. The decimation function typically has two objectives, namely reduction of the number of samples and an increase in the accuracy of the samples.

Sometimes a side effect of decimation is the most useful property, namely its low pass characteristic. Fast variations between samples 'disappear', or better, average out. Although the low pass characteristic really is a side effect, it is possible to make a low pass function without reducing the number of samples.

The way that the decimation function performs this operation is relatively straightforward. The samples are mixed together and averaged. The increase in accuracy is related to averaging the spread of the samples.

In electronic and software environments such decimation is a common function, used in many applications. In these fields a few factors typically influence the decimator, typically the input sample rate, the output sample rate, and the allowable chip real estate (hardware) and time (software).

Sometimes these factors are hard to satisfy. For example, it can happen that the input rate has a large dynamic range, whereas the output does not scale along with it. Such an example can be seen in PLL's, where the reference frequency may be as low as in the Hz range, but as high as 10 GHz. Sample processing at 10 GHz is not feasible with current technologies, and only limited processing, such as counting, is really feasible. Still, up to about 1 GHz current technologies can properly handle the processing, albeit at the cost of power and complexity.

The consequence of a large dynamic range for sampling implies that a decimator function may necessarily be flexible. Normally flexibility in a decimator requires extra hardware.

A conventional decimator is a structure with a group of memory buffers. The simplest form of decimator decimates by two. A single memory stores a first sample, which is added to a second sample to yield one combined sample. The second sampler uses a slower sampling rate; twice as slow. Such a structure is shown in FIG. 1.

If the circuit needs to be expanded to three samples being combined an extra memory and an extra adder operation are added. Such an arrangement is shown in FIG. 2, which illustrates decimation by 3. The adder operation can be shared in the time domain, but that in turn requires multiplexing hardware, which requires overhead.

FIG. 3 shows a decimator that does not need to change its sample rate. In such cases it is typically difficult to share adders, unless the decimator runs at much lower speeds than the system clock.

A decimator that averages for instance 128 samples requires a lot of hardware with the above structures. It is possible to change the structure slightly, so that at least the number of adder stages is limited, as is shown in FIG. 4. This structure uses an in-between integrated value, in which each sample is added and after a delay again subtracted. Thus the contribution of a single sample is only temporary, and at the same time the number of adders is limited to two. If this structure is expanded to 128 memory locations, the number of adders does not increase. The structure allows for a high outgoing sample rate. This can be important in certain applications, although they are probably few that do not use sample rate reduction. The structure, however, has a potential flaw if the digital parts are not 100% reliable. For instance, due to the presence of an alpha particle a memory location might change, and thus make a difference between the contents of the memory delay line and the extra integrator. This is unavoidable, and can only be repaired at high extra hardware or software cost. The structure can easily extended to any number of stages.

There is another problem with this structure, and that is the output divider. Only representations that fit well with the division are simple to divide. As such a ternary coding scheme allows simple division by 3. However, most digital hardware is based on binary coding, and thus is only simple to use with divisors that are powers of two; in that case the division is a simple shift, which does not cost any hardware. Most applications use division by powers of two and rate reduction. This can be achieved by using the circuit of FIG. 1 as a repeated module as shown in FIG. 5. This module can be repeated to reduce the sample rate in binary steps.

Which of the above prior art structures is most attractive for a particular application depends on many factors, and is not very easily established. Typical design factors are the process for which the design is intended, the sample rate and the sample size (wordsize). Microcontrollers and DSP's find a load of memory with a round robin structure attractive and fast; memory is low cost. Thus the structure shown in FIG. 4 is quite often most attractive. In hardware the cost of memory is typically not negligible, and the structure shown in FIG. 5 will quite often be more attractive. If the word size is very small, hardware in the form of the structure shown in FIG. 1 may in fact be quite attractive, since the total hardware size is small, even for large decimation numbers.

For all three structures, however, it is not very simple to introduce flexibility. Existing flexible structures normally use a mixed approach, as shown in FIG. 6. This module will normally be designed such that N can only take on powers of two; this somewhat limits the complexity of the module. The structure is now the same type of structure discussed, but not with rate changes of 2 per unit, but some other number N1, N2, N3 etc.

The structures that are relatively common have two or three modules, a fact which illustrates the attractiveness of this approach. The flexibility that typically is required will, even with this structure, require a considerable amount of programming of the constituent parts. In general this is highly unattractive.

SUMMARY OF THE INVENTION

According to the present invention there is provided a decimator for use in digital signal processing comprising an input line for receiving a sequence of input samples at a first sampling rate; a first register for accumulating input samples for which the order of said sequence is a power of a predetermined number greater than one; and a control unit for outputting samples from said first register at a second sampling rate.

In a preferred embodiment the invention also comprises a second register for accumulating input samples for which the order of said sequence is a not power of said predetermined number, and wherein said first register accumulates input samples for which the order of said sequence is a power of said predetermined number combined with a current accumulated value in said second register. The preferred number is preferably two, although other numbers greater than one can be employed.

The invention also provides a method of decimating an input signal in the form of a sequence of input samples at a first sampling rate, comprising accumulating input samples for which the order of said sequence is a power of a predetermined number greater than one; and outputting the accumulated samples a second sampling rate.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
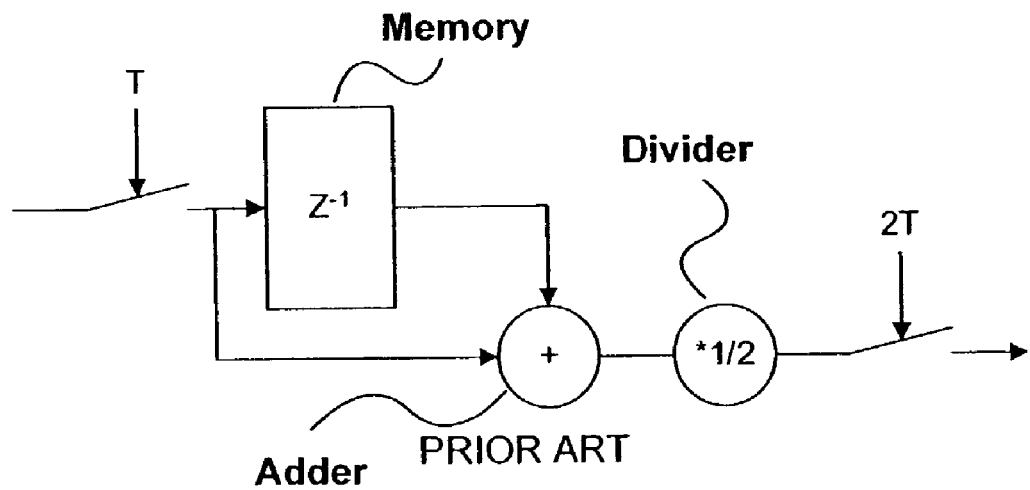
FIG. 1 is a first embodiment of a prior art decimator.
Figure 2:
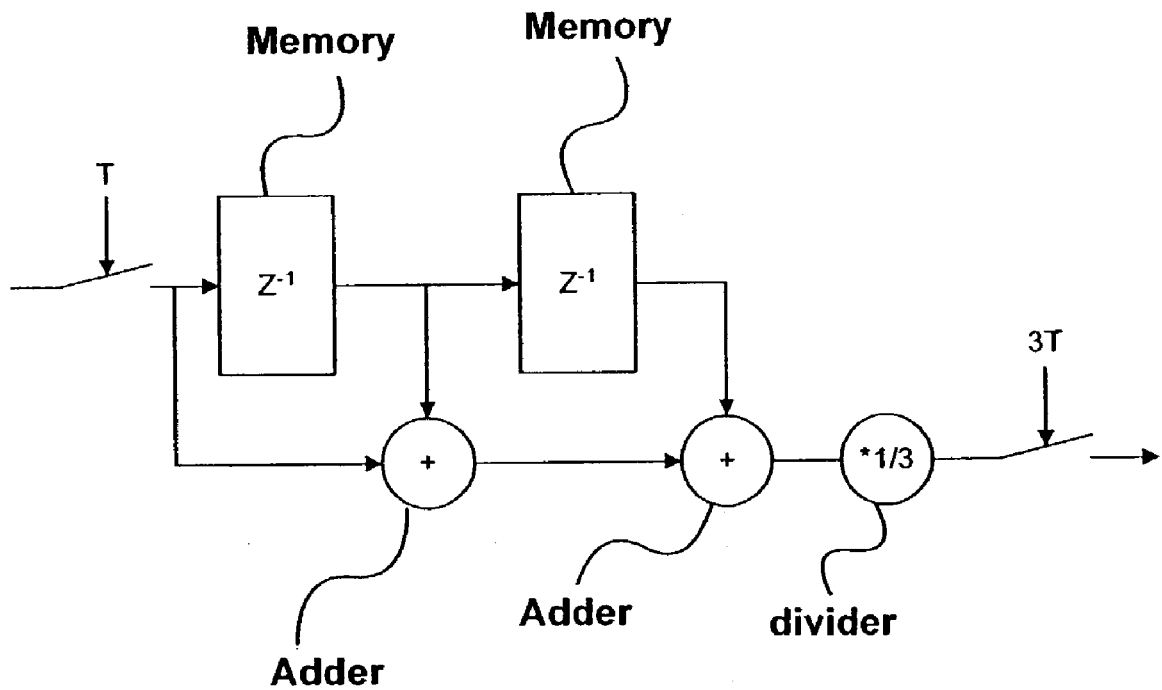
FIG. 2 is a second embodiment of a prior art decimator.
Figure 3:
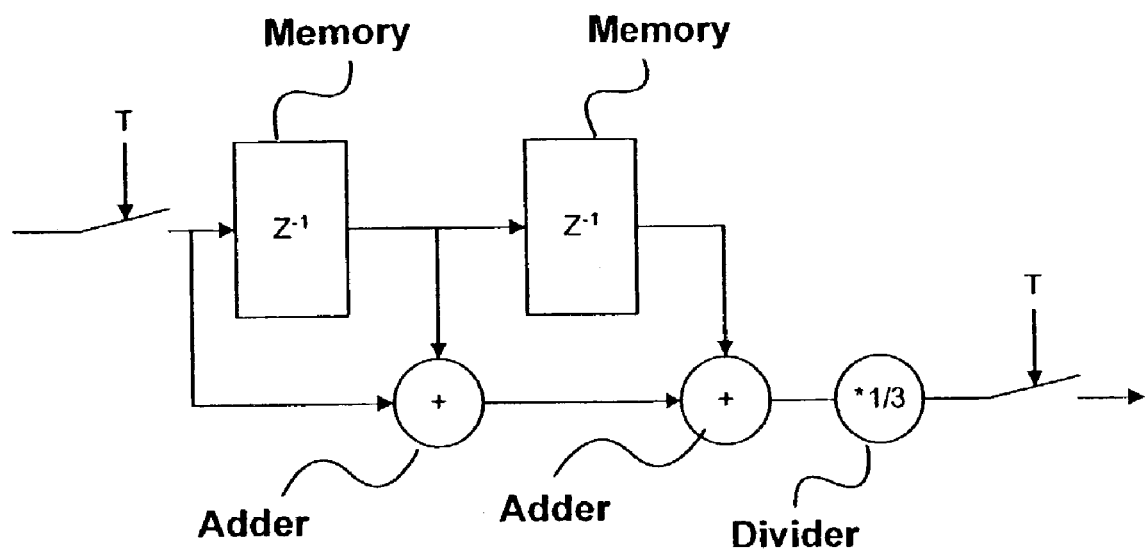
FIG. 3 illustrates a circuit for decimating by 3 without sample rate reduction.
Figure 4:
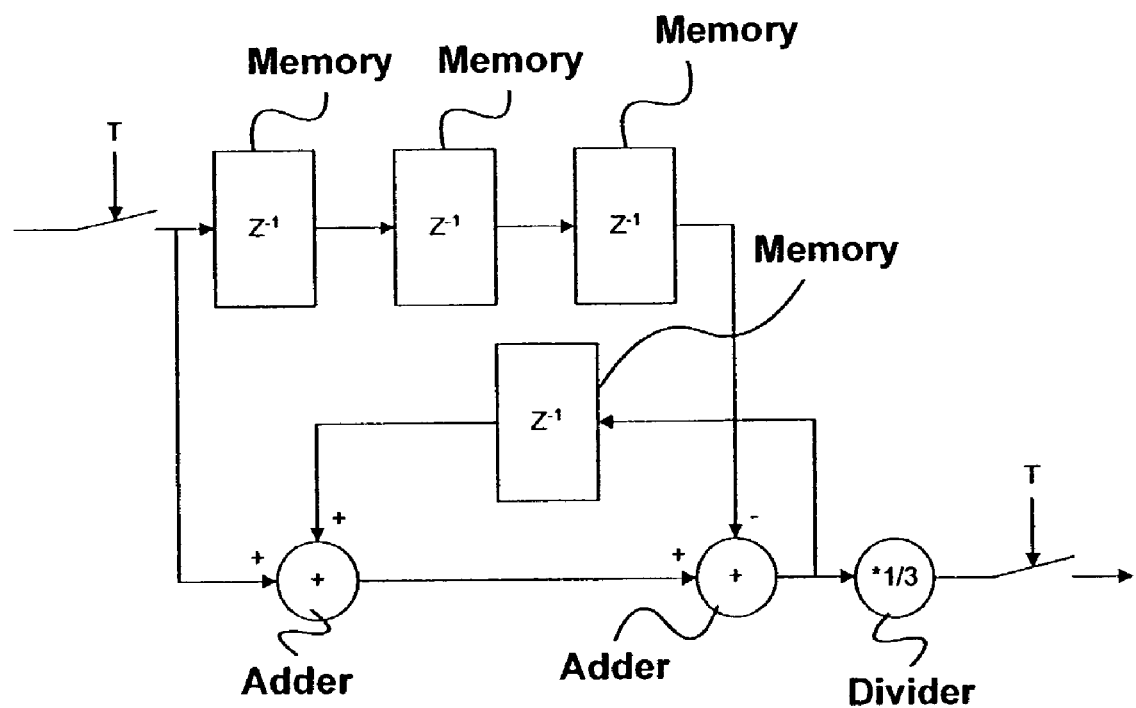
FIG. 4 shows a modified structure to reduce the number of adder stages.
Figure 5:
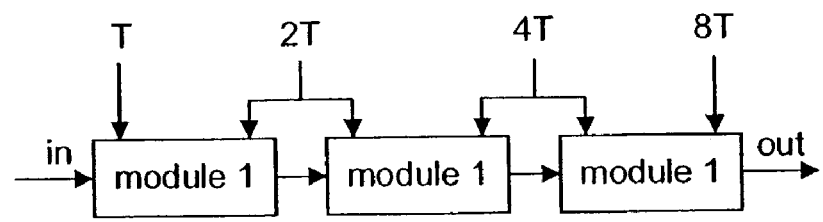
FIG. 5 shows the circuit of FIG. 1 used as a repeated module.
Figure 6:
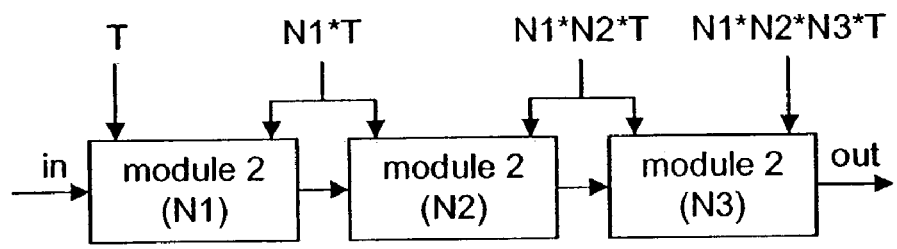
FIG. 6 shows a flexible decimator using a mixed approach.

The novel decimator is best explained first in mathematical equivalencies, since these show best illustrate the underlying principles of the invention. A normal decimator over M will perform the following operation:

$$\text{Output}(N) = \frac{\sum_{i=0}^{M-1} \text{Input}(N*M+i)}{M}$$

This means that the output process is M times slower than the input process, and that the output is the average of the last block of M samples.

It is simple for a decimator to process only a number of samples that is equal to a power of two. This makes the division equal to a simple shift, which in general is preferable. The operation of the decimator is to collect samples until a power of two is reached (so 1, 2, 4 etc), and then keep that value as a decimated value. If the value is sampled, that value is presented. If the next power of two is reached without an output sample having occurred, the new (larger) power of two is kept as the decimated value. Thus each sample effectively contains the largest number of samples in the recent history of input samples, for which the number of samples is a power of two.

The method can be formalized by using a mathematical recurrent expression:

$$\text{Output}(M) = \frac{\left[\sum_{p=0}^{N} \text{Input}(p)\right] - \left[\sum_{q=0}^{M-1} \text{Output}(q)*\text{ns}(q)\right] - \left[\sum_{r=\alpha}^{N} \text{Input}(r)\right]}{\text{ns}(M)}, \quad \text{Formula 1}$$

$$\alpha = \sum_{s=0}^{M} \text{ns}(j), \text{ns}(M) \leq N - \sum_{i=0}^{M-1} \text{ns}(t), \text{ns}(M) = 2^x, N - \alpha < 2^x, x \in N$$

This formula is quite complex and is best discussed in its parts. First the summation of the decimation:

$$\text{Output}(M) = \frac{\left[\sum_{p=0}^{N} \text{Input}(p)\right] - \left[\sum_{q=0}^{M-1} \text{Output}(q)*\text{ns}(q)\right] - \left[\sum_{r=\alpha}^{N} \text{Input}(r)\right]}{\text{ns}(M)}$$

This sets the output as the remainder of the total of all N input samples minus all M samples that are already been sampled on the output (times the number of input samples that were part of that output sample for correct weighting) minus the part of the input samples (the most recent few samples) that are not yet contained in the output.

The formula can be rearranged by moving the left hand side to the right hand side, to obtain a slightly more compact and more mathematical formula:

$$0 = \left[\sum_{p=0}^{N} \text{Input}(p)\right] - \left[\sum_{q=0}^{M} \text{Output}(q)*\text{ns}(q)\right] - \left[\sum_{r=\alpha}^{N} \text{Input}(r)\right] \quad \text{Formula 2}$$

No information is lost or repeated as long as the decimator remembers the summation of all input samples minus all the samples that have already left the circuit, minus all the samples that are still somewhere in processing. The proof that no information is lost is of some importance for correctness under all circumstances.

Another form of rewriting the same formula yields:

$$\text{Output}(M)*\text{ns}(M) + \left[\sum_{r=\alpha}^{N} \text{Input}(r)\right] = \quad \text{Formula 3}$$

$$\left[\sum_{p=0}^{N} \text{Input}(p)\right] - \left[\sum_{q=0}^{M-1} \text{Output}(q)*\text{ns}(q)\right]$$

which states that the current output, multiplied by the number of samples (so the undivided output), plus the most recent piece of data that is not yet 'decimated', equals the complete history of input minus the output up to the present time. This formula is central to the implementation of the invention.

Then the part that chooses how many samples there in a specific output sample, namely $$\alpha = \sum_{s=0}^{M} ns(j), ns(M) \le N - \sum_{i=0}^{M-1} ns(t), ns(M) = 2^x, N - \alpha < 2^x, x \in N:$$

can also be rewritten as:

$$\alpha = \sum_{s=0}^{M} ns(j), 0 \le N - \sum_{t=0}^{M} ns(t), ns(M) = \quad \text{Formula 4}$$

$$2^x, N - \alpha < 2^x, x \in N \Rightarrow 0 \le N - \alpha < 2^x, ns(M) = 2^x,$$

$$x \in N, \alpha = \sum_{s=0}^{M} ns(j)$$

This makes the number of samples (ns) in each output sample equal to the maximum power of two that fits (for the remainder that is not processed yet is smaller than that number).

The formulae well explain the implementation of the invention. However, there are aspects of the formulae that are of importance. If both input and output sample rates are such that they have a fixed ratio of a two power which is $2^\beta$, the integers x for the respective M samples all will be identical to $\beta$. Rephrased, the number of input samples in each output sample will be fixed and equal to $2^\beta$. If both input and output sample rates are such that they have a fixed ratio, which is not a two power, but a number $\gamma$, with $2^\beta < \gamma < 2^{\beta+1}$, the number of samples in any output sample will be either $2^\beta$ or $2^{\beta+1}$. Only when the sampling rates are variable compared to each other, will the number of samples in a single output sample have a variance that is larger than a maximum factor 2. This factor two is the difference between the number $2^\beta$ and $2^{\beta+1}$.

From these observations a number of derivative observations can be concluded. For normal processes where the sample rates have a fixed ratio which is not a power of two, the formulae would lead to a sample distance that varies with a factor of 2, which is the difference between $2^\beta$ and $2^{\beta+1}$. It may be expected that the processes will use some form of oversampling. The places where $2^{\beta+1}$ samples are summed, the oversample rate will be $2^{(\beta+1-^2log(\gamma))} \le 2^{(\beta+1-\beta)}=2$ reduced by a factor.

If the oversample rate is high, the reduction of the sample rate yields only limited inaccuracies. Depending on the precise error behaviour (so also dependent on the feeding process) the error behaviour can be calculated or estimated. If the rate variations force a bigger change of sample rate ratio than 2 it is relatively simple to develop some idea of the related inaccuracies.

Figure 7:
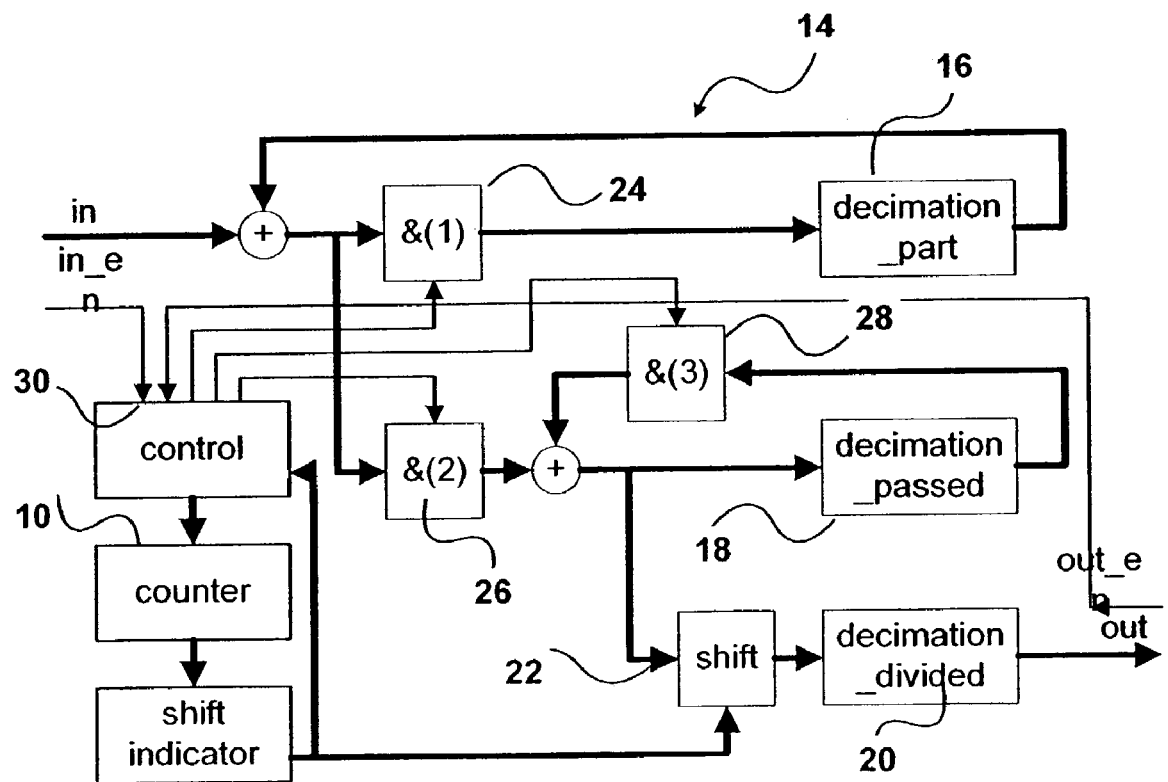
FIG. 7 is a block diagram of a first embodiment of the invention.

FIG. 7 is a block diagram of a first embodiment of the invention based on the above analysis. The circuit has two major parts, namely a counter 10 and shift indicator 12 component that generally implements formula 4 and a datapath component 14 that generally implements formula 3.

The circuit has an input, indicated as in and an enable line in-en. The latter provides the sample signal for the input, an output, indicated by datalines out and enable line out-en. The latter is the sample signal from an external circuit into the flexible decimator.

The circuit has several registers, decimation_part 16, decimation_passed 18 and decimation_divided 20. The critical memory elements are the decimation_passed and decimation_part registers.

The register decimation_passed 18 contains all accumulated samples for the most recent occurring samples that are a power of 2, i.e. $2^0$, $2^1$, $2^2$, $2^3$ etc. or, 1, 2, 4, 8 etc.

The register decimation_part 16 contains all accumulated samples that have not been stored in decimation_passed register 18. Thus its contents may be sample 3, or sample 5, or sample 5 plus sample 6 etc.

The register decimation_passed 18 contains the total accumulated version. However, a decimator should also divide its output by the number of samples accumulated in the register. The register that contains the divided version of decimation_passed is register decimation_divided 20.

The shift unit 22 performs the division. Since circuit operates on powers of two, a simple shift block is sufficient to implement a divider. The shift value, held by the block shift_indicator 12, is a function of the value of the counter 10 at the moment when the last power of two was reached.

The counter 10 is incremented by one for each incoming sample and decremented by the most recent reached power of two for each sample on the output. The only limitation on the latter is that the counter must always remain positive. This means that two samples on the output that appear relatively quickly after each other, may lead to only one decrement, namely on the first sample.

The & blocks 24, 26, 28 are AND gates; by having the control unit 30 put a 0 signal on the control inputs of the AND blocks, all output bits can be reset. In this way AND block 24 resets the decimation_part register, AND block 26 makes sure that the decimation_passed register is maintained at the same value (no extra added value), and AND block 28 resets the decimation_passed register.

Decimation_part register 16 is always reset unless there is an input sample when the power of two limit is not yet reached; then the sample must be stored in decimation_part register 16.

Decimation_passed register 18 is always kept stable by resetting AND block 26 unless there is an input sample available, and the power of two limit is reached. The decimation_passed register 18 is reset with AND block 28 when the output sample is taken.

In the memory decimation_passed register 18 the first term is found:

Output(M)*ns(M)

with the ns(M) always a power of two.

In the memory decimation part_register 16, the second term can be found:

$$\sum_{r=\alpha}^{N} \text{Input}(r)$$

A typical sequence of contents that might appear in these two components would, assuming no samples are fetched from the output, be as follows:

| Sample # | Counter position | decimation_part | decimation_passed | # samples decimation_passed |
|---|---|---|---|---|
| 0 | $1 = 2^0$ | 0 | sample(0) | $1 = 2^0$ |
| 1 | $2 = 2^1$ | 0 | Σ sample(0,1) | $2 = 2^1$ |
| 2 | $3 = 2^1 + 2^0$ | sample(2) | Σ sample(0,1) | $2 = 2^1$ |
| 3 | $4 = 2^2$ | 0 | Σ sample(0 ... 3) | $4 = 2^2$ |
| 4 | $5 = 2^2 + 2^0$ | sample(4) | Σ sample(0 ... 3) | $4 = 2^2$ |
| 5 | $6 = 2^2 + 2^1$ | Σ sample(4,5) | Σ sample(0 ... 3) | $4 = 2^2$ |
| 6 | $7 = 2^2 + 2^1 + 2^0$ | Σ sample(4 ... 6) | Σ sample(0 ... 3) | $4 = 2^2$ |
| 7 | $8 = 2^3$ | 0 | Σ sample(0 ... 7) | $8 = 2^3$ |
| 8 | $9 = 2^3 + 2^0$ | sample(8) | Σ sample(0 ... 7) | $8 = 2^3$ |

The first two samples go into the decimation_passed register since they are powers of two. The third sample goes into the decimation_part register since it is not a power of two.

Of course the sampling on the output may also appear on some places, which drastically changes the contents. The designation 0 means no sample, 1 means sample.

| Sample # | Counter position | decimation_part | decimation_passed | # samples dec_passed | output sample? |
|---|---|---|---|---|---|
| 0 | $1 = 2^0$ | 0 | sample(0) | $1 = 2^0$ | 0 |
| 1 | $2 = 2^1$ | 0 | Σ sample(0, 1) | $2 = 2^1$ | 1 |
| 2 | $1 = 2^0$ | 0 | sample(2) | $1 = 2^0$ | 0 |
| 3 | $2 = 2^1$ | 0 | Σ sample(2, 3) | $2 = 2^1$ | 0 |
| 4 | $3 = 2^1 + 2^0$ | sample(4) | Σ sample(2, 3) | $2 = 2^1$ | 1 |
| 5 | $2 = 2^1$ | 0 | Σ sample(4, 5) | $2 = 2^1$ | 0 |
| 6 | $3 = 2^1 + 2^0$ | sample(6) | Σ sample(4, 5) | $2 = 2^1$ | 0 |
| 7 | $4 = 2^2$ | 0 | Σ sample(4 ... 7) | $4 = 2^2$ | 1 |
| 8 | $1 = 2^0$ | 0 | sample(8) | $1 = 2^0$ | 0 |

It will be seen that the new counter position is now radically different. For each output sample the decimation_passed register is emptied into the output. Thus each next counter position is, relative to the previous one, 1 higher (1 sample in) minus the number of samples in decimation_passed*(output sample). So each time the output is sampled, the counter position is reduced by the number of samples in decimation_passed.

From these tables it becomes apparent that the AND functions are used for resetting the decimation_passed and decimation_part registers, and also enabling the addition of extra samples from the decimation_part register into the decimation_passed register.

The major advantages in this approach relative to older approaches are the fact that the external sample rate may be chosen independently of the internal process without requiring any setting. A large dynamic range may be achieved by adding enough bits on the word size of decimation_part, decimation_passed and the counter. Each factor of 2 adds one bit on each of these structures. In older structures the extra hardware requires complete registers. So the hardware is in the new solution is relatively small. This is less costly and power hungry. A dynamic range of a factor $2^{16}$ is for instance quite simple to implement. The decimator also works for any external sample rate ratio (input/output) whereas the ratio itself may even be dynamic.

There are a few other properties that make the above solution relatively advantageous compared to other circuits that could be derived from the same formulae. Samples are stored in one memory only. In case of hardware failures this ensures that no long term errors can arise. This makes the design robust. The checks of the counter positions are quite straightforward to implement, just like the remainders of the datapath. The separation of the shift operator from the internal memories makes it simple to do the division as a post process, instead of inline. The inline process would require shifting on each storage and fetch from decimation_passed. The post process in the form of a shift also yields the possibility to perform some other operation for the shift.

Figure 8:
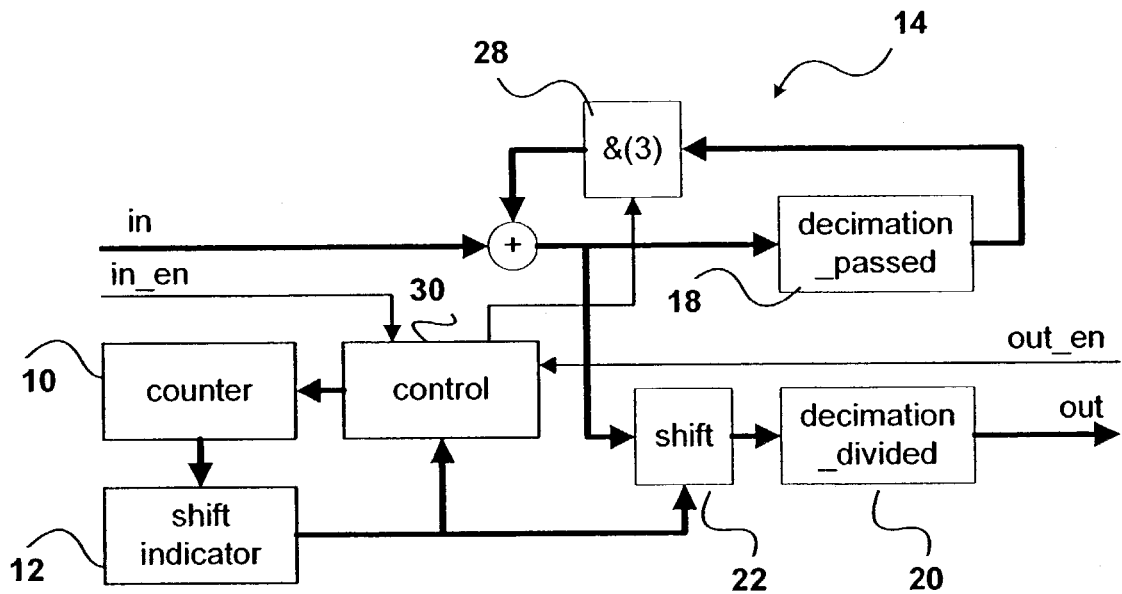
FIG. 8 is a block diagram of a second embodiment of the invention.

For many applications decimation is a simple matter of combining the samples, and the actual number used for division is not very relevant. In fact, if the division is done with the wrong number, the results will simply be wrong by some gain factor. In the situation where the input and output sample rates have a fixed ratio, which is not a power of two, using a fixed division which is a two power is in many applications fully acceptable. Thus each quantity of samples in the decimator is in fact equal to a possible endvalue. Thus the structure would change to a simpler circuit as shown in FIG. 8.

The circuit will now just integrate the samples from the input and present the integrated value, not necessarily with the correct division, but with an approximately correct shift. Therefore the maximum division error is almost 2.

Figure 9:
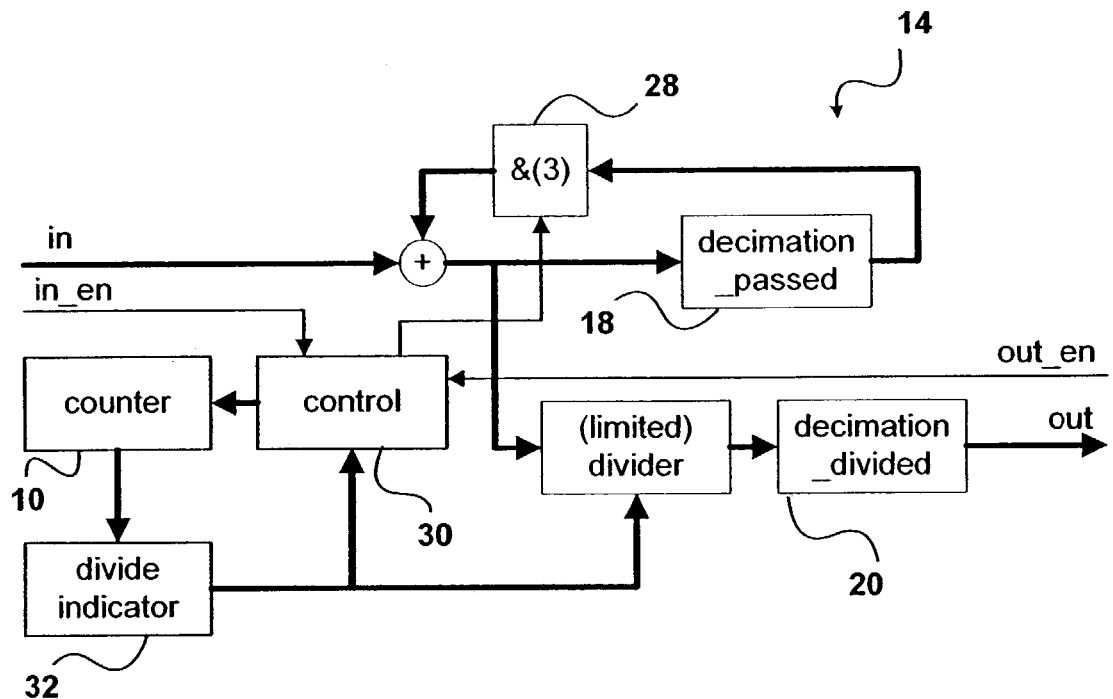
FIG. 9 is a block diagram of a third embodiment of the invention.

If the division error is too large, a reduced complexity divider may be appropriate as shown in FIG. 9. Such a divider can be built with simple shift and add operators, so that the maximum error is reduced. In an example; division by 3 could with a shift only be implemented as division by 2 (gain error ⅙, signal too large) or division by 4 (gain error 1/12, signal too small). By choosing a shift/add combination of division by 4 and 8, the result would be a weighting of ⅜, which leaves an error of 1/24, which halves the earlier maximum error. Of course, this approach can be expanded to encompass a complete normal divider. If the decimator decimates with a large number such a division may have enough time to be executed; the division is not necessary very often. In this case the counter 10 is associated with a divide indicator 32.

In the first formula the base number was always a power of two since that yielded a simple division in the form of a binary shift. In fact, if the decimation is coded as a number of BCD terms, shifting over a BCD section would yield a division by 10. If that is more attractive than the standard binary shift, such coding is implicitly attractive, although the hardware is slightly more complex. Such coding is applicable to any base number, inclusive 3 (ternary coding), 4 (which is just a power of 2), 5 (quintary coding) etc. This change does in fact not change the block diagram, but merely the coding inside the blocks.

Figure 10:
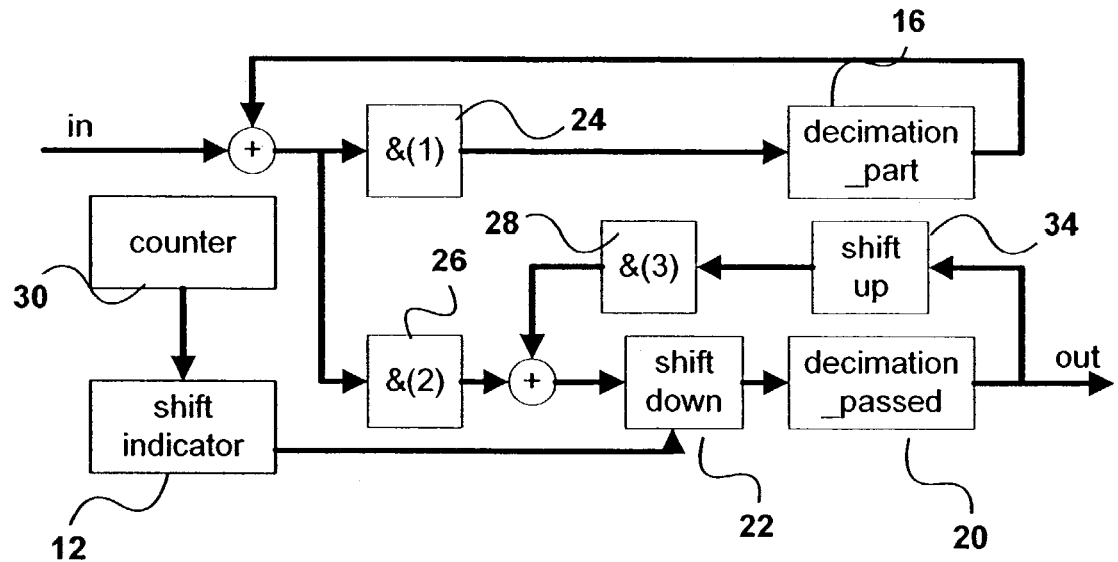
FIG. 10 is a block diagram of a fourth embodiment of the invention.

Other variations of the invention are also possible. Of course the block diagrams allow for quite a variety of implementations. One such variant, shown in FIG. 10, uses the shift part and/or the doubling of memory locations, especially as a variant of the first embodiment.

In this embodiment there is a shift 34 inside decimation memory loop. This block diagram has two shifts (in order to maintain correct addition) in the memories. The drawbacks, however, are extra hardware requirements (two shifters instead of one) and smaller margins on timing.

Figure 11:
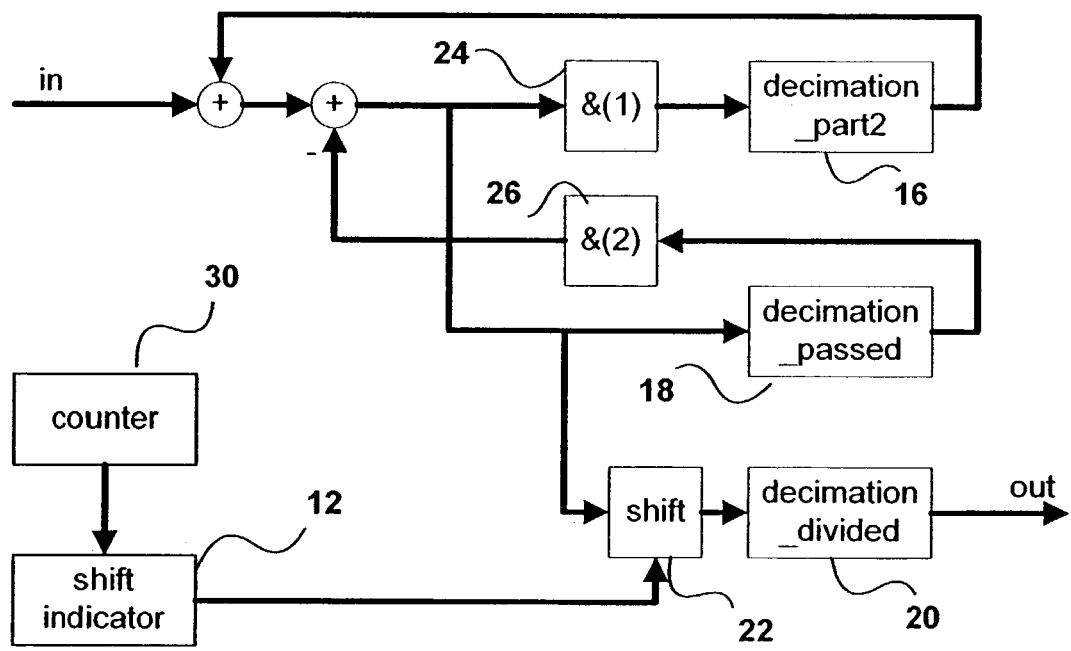
FIG. 11 is a block diagram of a fifth embodiment of the invention.

Another embodiment with redundant data is shown in FIG. 11. The decimation_part2 16 is now the sum of the earlier decimation_part (so all samples that were not part of a final decimation yet), and the final decimation sofar. Every time the decimated data is fetched, the contents of decimation_passed is subtracted from decimation_part2. Although the hardware is slightly less complex (one less AND stage), the redundancy of data makes the solution not as good as the earlier embodiment.

Figure 12:
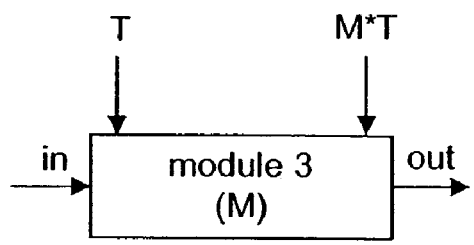
FIG. 12 shows an auto-adaptive structure in accordance with the invention.
Figure 13:
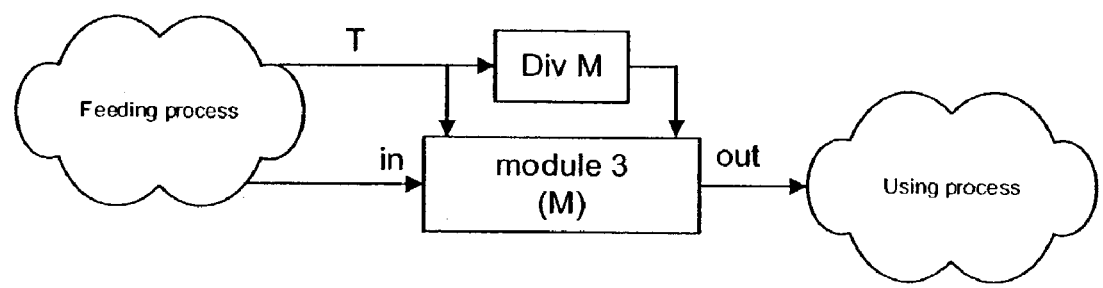
FIG. 13 shows a typical application of the invention.

The invention in effect an auto adaptive structure that does not require any setting as shown in FIG. 12. This module adapts its output rate to match as closely as possible the externally defined sample rate (sample period: M*T). This structure can be used in two common situations. The first is shown in FIG. 13. In this figure, the input rate and the output rate are hard related.

Figure 14:
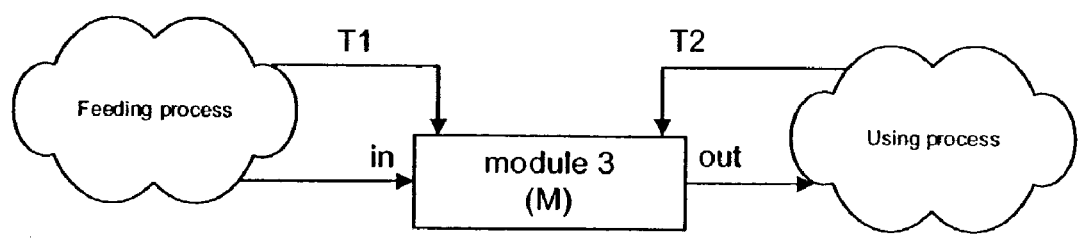
FIG. 14 shows another typical application of the invention.

FIG. 14 shows another typical application of a decimator in accordance with the invention. The sample rates on input are generated by independent processes, so that the relation between the sample periods is not well defined. In this case, the sample rates can even have a fractional relationship.

It will be apparent to one skilled in the art that many additional variations of the invention are possible without departing from the scope of the appended claims.

The invention claimed is:

1. A decimator for use in digital signal processing comprising:
    an input line for receiving a sequence of input samples at a first sampling rate;
    a first register for accumulating input samples in said sequence that are sequential powers of a predetermined number greater than one;
    a second register for accumulating the remaining input samples in said sequence that are not sequential powers of said predetermined number greater than one;
    an adder for combining the accumulated output of the second register with the input samples; and
    a control unit for deriving output samples at a second sampling rate from the output of said first register.

2. A decimator as claimed in claim 1, further comprising a counter that is incremented as each input sample is received and decremented by a number equal to the most recently reached power of said predetermined number as a sample is output, said counter controlling the passing of samples to said first and second registers.

3. A decimator as claimed in claim 2, comprising a first logic element for controlling access to said first register, said first logic element being controlled by said control unit.

4. A decimator as claimed in claim 3, wherein said first logic element is an AND gate.

5. A decimator as claimed in claim 3, further comprising a second logic element for controlling access to and resetting said second register, said second logic element being controlled by said control unit.

6. A decimator as claimed in claim 5, wherein said second logic element is an AND gate.

7. A decimator as claimed in claim 6, wherein said third logic element is an AND gate.

8. A decimator as claimed in claim 5, further comprising a third logic element for resetting said first register, said third logic element being controlled by said control unit.

9. A decimator as claimed in claim 8, further comprising a second adder having inputs respectively receiving the outputs of said second and third logic elements and an output connected to an input of said first register.

10. A decimator as claimed in claim 2, further comprising a divider for dividing said output samples.

11. A decimator as claimed in claim 10, wherein said divider comprises a shift unit controlled by said counter.

12. A decimator as claimed in claim 11, further comprising an output register receiving and storing divided samples from said shift unit ready for output at said second sampling rate.

13. A decimator as claimed in claim 1, wherein said predetermined number is two.

14. A method of decimating an input signal in the form of a sequence of input samples at a first sampling rate, comprising:
    accumulating first input samples in said sequence that are sequential powers of a predetermined number greater than one;
    accumulating the remaining input samples in said sequence that are not sequential powers of said predetermined number greater than one;
    combining the accumulated remaining input samples with the input samples; and
    deriving output samples at a second sampling rate from the samples accumulated in the first register.

15. A method as claimed in claim 14, wherein the current accumulated value of the accumulated remaining input samples is added to said input samples.

16. A method as claimed in claim 15, further comprising maintaining a running count of received input samples and incrementing said count when a new input sample is received and decrementing said count number equal to the most recently reached power of said predetermined number as a sample is output, and controlling the accumulation of said input samples on the basis of said running count.

17. A method as claimed in claim 16, further wherein the output samples are divided prior to being output by a number equal to the number of samples making up the output samples.

18. A method as claimed in claim 17, wherein said division is carried out as a shift operation.

19. A decimator as claimed in claim 14, wherein said predetermined number is two.

* * * * *